(12) United States Patent
Kertis

(10) Patent No.: US 6,239,933 B1
(45) Date of Patent: May 29, 2001

(54) METHOD AND CIRCUITS FOR HIGH SPEED POWERUP OF ANALOG REFERENCE SOURCE FOR A DIRECT ACCESS STORAGE DEVICE (DASD)

(75) Inventor: Robert Andrew Kertis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/246,240

(22) Filed: Feb. 8, 1999

(51) Int. Cl.[7] ........................................ G11B 5/03
(52) U.S. Cl. ................. 360/66; 360/67; 360/46; 330/127; 327/530
(58) Field of Search ................... 360/66, 67, 68, 360/46; 330/127; 327/545, 544, 538, 535, 530, 112, 111, 108

(56) References Cited

U.S. PATENT DOCUMENTS 5,426,542 * 6/1995 Smith ..................................... 360/66

* cited by examiner

Primary Examiner—Alan T. Faber
(74) Attorney, Agent, or Firm—Joan Pennington

(57) ABSTRACT

A method and circuits are provided for high speed powerup of an analog reference source, such as used in a direct access storage device (DASD). The high speed powerup circuits for the analog reference source include a biasing current source. Biasing circuitry is provided for establishing a first bias reference voltage level. An enable input is provided for disabling and for enabling powerup of the analog reference source. A transistor switch is coupled between the bias reference voltage level and the analog reference source. The transistor switch is operatively controlled by the enable input for driving the analog reference source and enabling fast powerup of the analog reference source.

18 Claims, 4 Drawing Sheets

US 6,239,933 B1

METHOD AND CIRCUITS FOR HIGH SPEED POWERUP OF ANALOG REFERENCE SOURCE FOR A DIRECT ACCESS STORAGE DEVICE (DASD)

FIELD OF THE INVENTION

The present invention relates to the data processing field, and more particularly, relates to a method and circuits for high speed powerup of an analog reference source for use in a direct access storage device (DASD).

DESCRIPTION OF THE RELATED ART

As channel speeds increase, conventional arrangements of circuit functions can be a limiting factor in overall performance in a direct access storage device (DASD). In the design of new DASDs, the performance requirements are more demanding and faster operation generally is required.

A need exists for fast powerup of an analog reference voltage which can be used for generating gate voltages of current sources or base voltages of current sources.

SUMMARY OF THE INVENTION

A principal object of the present invention is to provide an improved method and circuits for high speed powerup of an analog reference source, such as used in a direct access storage device (DASD).

In brief, a method and circuits are provided for high speed powerup of an analog reference source, such as used in a direct access storage device (DASD). The high speed powerup circuits for the analog reference source include a biasing current source. Biasing circuitry is provided for establishing a first bias reference voltage level. An enable input is provided for disabling and for enabling powerup of the analog reference source. A transistor switch is coupled between the bias reference voltage level and the analog reference source. The transistor switch is operatively controlled by the enable input for driving the analog reference source and enabling fast powerup of the analog reference source.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
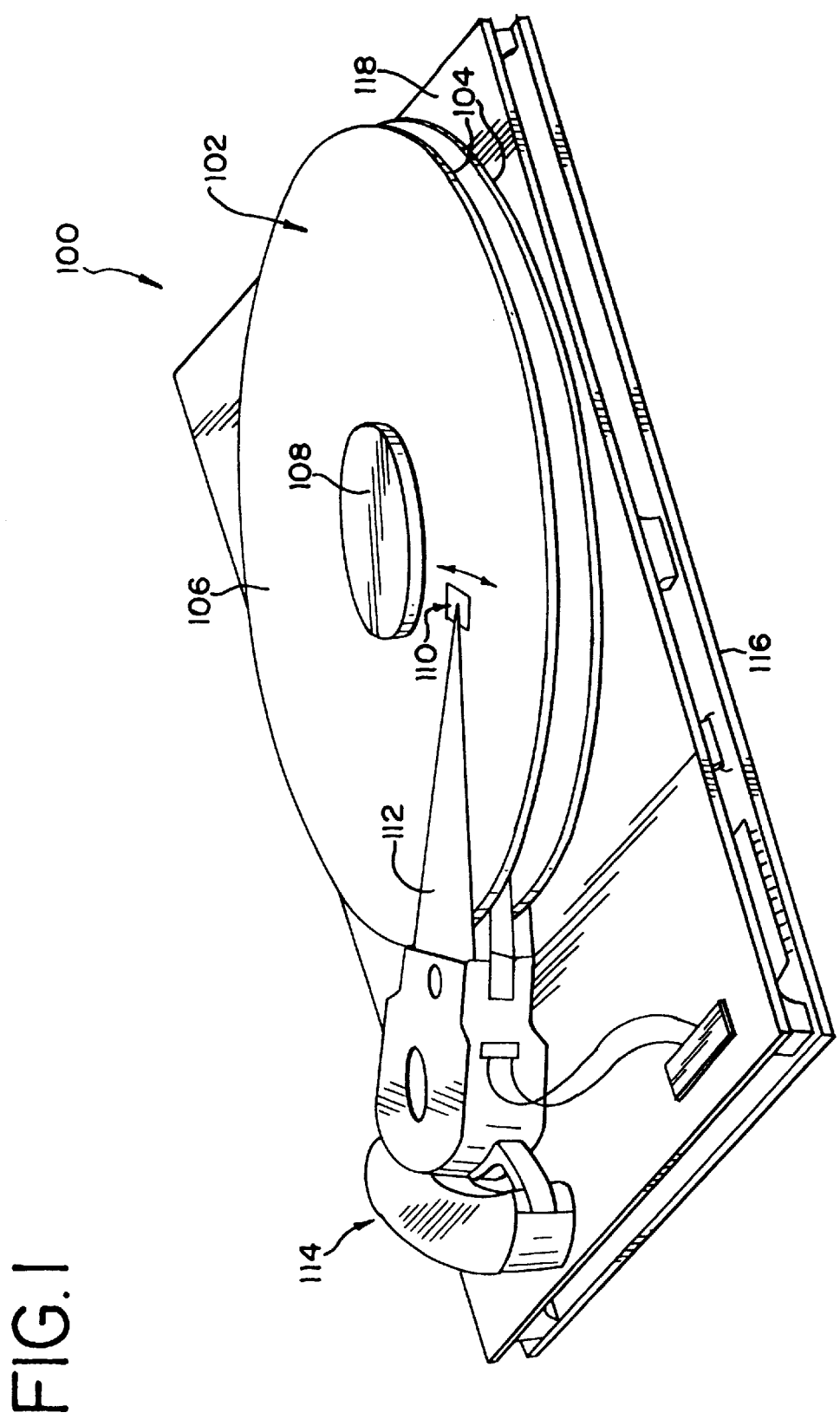
FIG. 1 is a diagrammatic view of a direct access storage device (DASD) embodying the present invention.

Having reference now to the drawings, in FIG. 1 there is illustrated a direct access data storage device (DASD) generally designated as 100 including a stack 102 of disks 104 each having at least one magnetic surface 106. The disks 104 are mounted parallel to one another for simultaneous rotation on and by an integrated spindle and motor assembly 108. Information on each magnetic disk surface 106 is read from or written to the disk surface 106 by a corresponding transducer head assembly 110 movable in a path having a radial component across the rotating disk surface 106.

Each transducer head assembly 110 is carried by an arm 112. The arms 112 are ganged together for simultaneous pivotal movement by a voice coil motor (VCM) magnet assembly 114. Drive signals applied to the VCM magnet assembly 114 cause the arms 112 to move in unison to position the transducer head assemblies 110 in registration with information storage tracks on the disk surfaces 106 where information is written or read. As shown in FIG. 1, an electronics card 116 is mounted together with a base support 118 of DASD 100. The utility of the present invention is not restricted to the details of a particular DASD construction.

Figure 2:
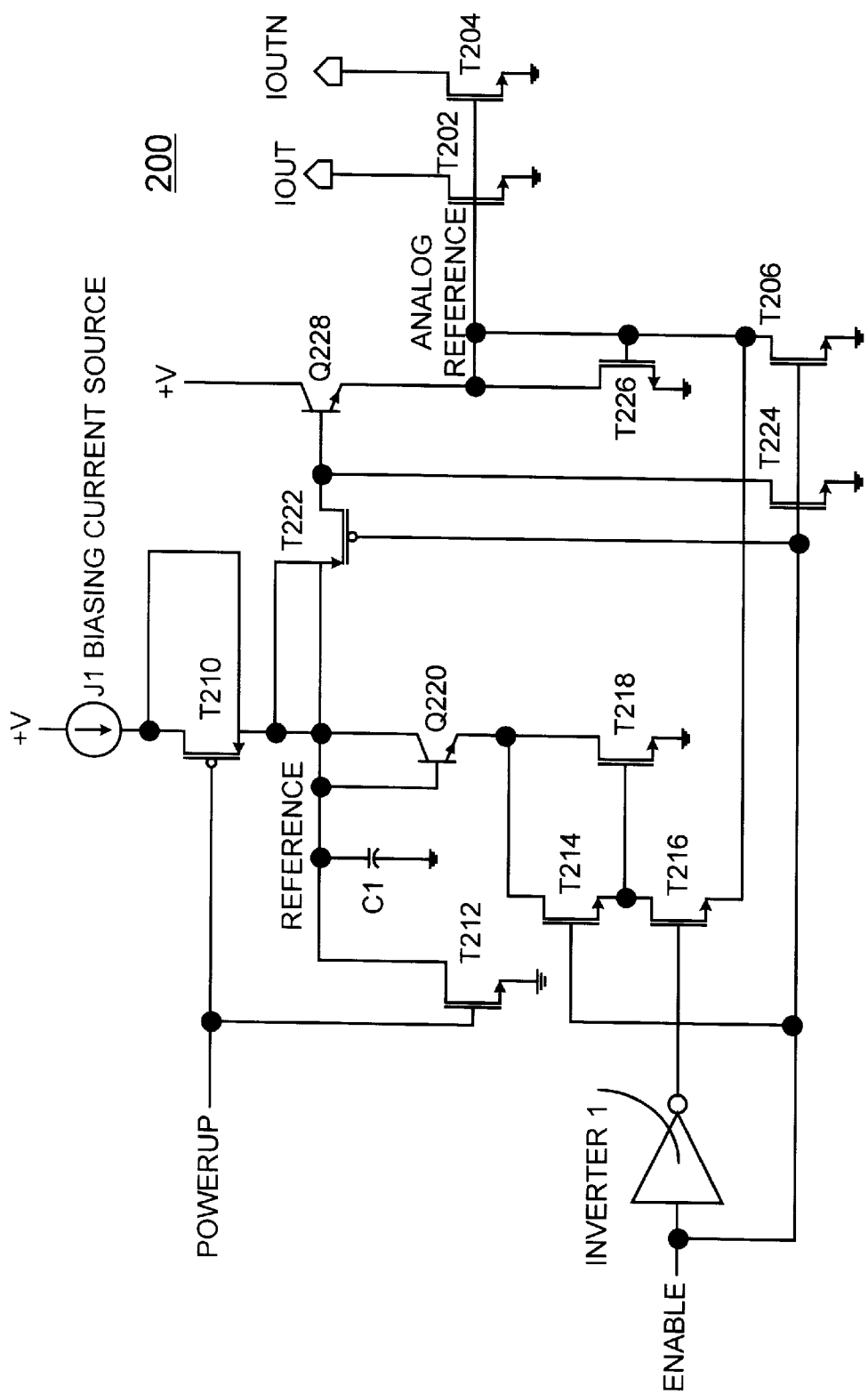
FIG. 2 is a schematic diagram representation of a first circuit for high speed powerup of an analog reference source, for example, used in a direct access storage device (DASD) in accordance with the present invention.

Referring now to FIG. 2, there is shown a first circuit for high speed powerup of an analog reference source, for example, used in the direct access storage device (DASD) 100, generally designated by the reference character 200 and arranged in accordance with the present invention. In accordance with features of the invention, a capacitive loaded reference node labeled REFERENCE, is biased to a set reference voltage level by circuit 200. The set reference voltage level is established to provide fast powerup of an ANALOG REFERENCE node when an ENABLE signal is invoked.

First high speed powerup circuit 200 includes a plurality of current source N-channel field effect transistors (NFETs) T202, T204. A gate input of each of the multiple current source NFETs T202, T204 is connected to the drain of a N-channel field effect transistor NFET T206. The gate input of the NFET T206 is connected to an enable input labeled ENABLE of the first high speed powerup circuit 200. The NFET T206 is operatively controlled by the enable input. The NFET T206 is turned on with a high enable input and turned off with a low enable input. First high speed powerup circuit 200 includes a capacitor C1 connected between the reference node labeled REFERENCE and ground for proper phase margin in the reference loop. In conventional arrangements this capacitor C1 needed for loop stability, hinders the powerup rate of the current sources.

First high speed powerup circuit 200 includes a biasing circuitry for biasing the capacitive loaded REFERENCE node to the set reference voltage level. A biasing current source J1 charges up the capacitor C1 through the P-channel field effect transistor (PFET) 210. PFET 210 is turned on with a low gate input indicated at a line POWERUP. The low POWERUP input is applied to the gate input of an NFET 212 that is connected between the REFERENCE node and ground. Biasing circuitry includes a first pair of series connected NFETs 214, 216 and a second pair of series connected transistors NFET 218 and a bipolar NPN transistor Q220. NFETs 214, 216 have a common series connected node connected to the gate of an NFET 218. NFET 216 is connected to the gate of current source NFETs T202 and T204 and to the drain of NFET 206. The ENABLE input is applied to the gate input of an NFET 214. The ENABLE input is inverted by an inverter 1 and applied to the gate input of an NFET 216. The bipolar NPN transistor Q220 is connected between PFET 210 and NFET 218. The high ENABLE input turns on NFET 214 with the inverted high ENABLE input holding off NFET 216. The low ENABLE input holds off NFET 214 with the inverted low ENABLE input turning on NFET 216. With the inverted low ENABLE input turning on NFET 216, a feedback path is provided from the ANALOG REFERENCE node to the gate of NFET 218.

The capacitor C1 biased up to the set REFERENCE voltage level is connected to a source input of a PFET 222 having its gate connected to the ENABLE input. The low ENABLE input turns on the PFET 222 which is held off by the high ENABLE input. The drain of PFET 222 is connected to ground by an NFET 224 having the ENABLE input connected to its gate input. The HIGH enable input applied to the gates of NFETs 224 and 206 turns on the NFETs 224 and 206. The low ENABLE input holds off the NFETs 224 and 206. An NFET 226 having its gate connected to the gate of current source NFETs T202, T204 is connected between a powerup helper bipolar NPN transistor 228 and ground. The base of the powerup helper bipolar NPN transistor 228 is connected to the drain of PFET T222. The emitter of the powerup helper bipolar NPN transistor 228 is connected to the gate of current source NFETs T202, T204.

NPN transistor Q228 enables fast operation of the current source NFETs T202, T204 with the capacitor C1 already biased up and switchable via PFET 222 to the NPN transistor Q228 to drive the reference gate voltage of current source NFETs T202, T204 or ANALOG REFERENCE source. When the PFET T222 is disabled or turned off, the biasing circuitry transistor T214 is enabled, so that the stack of biasing circuitry transistors Q220, T218 is biased up from the current source J1. The biasing circuitry transistor T214 is connecting the drain of transistor T218 to its gate. Transistor T218 is connected as an NFET diode. The gate of T218 is provided at a voltage compatible with the current supplied by current source J1. When the PFET T222 is turned on, then the helper bipolar transistor Q228 is turned on. The emitter of the helper transistor Q228 is connected back to the biasing circuitry transistor T218, with transistor T216 now turned on. The feedback bias loop is activated when the ENABLE signal is invoked.

Figure 3:
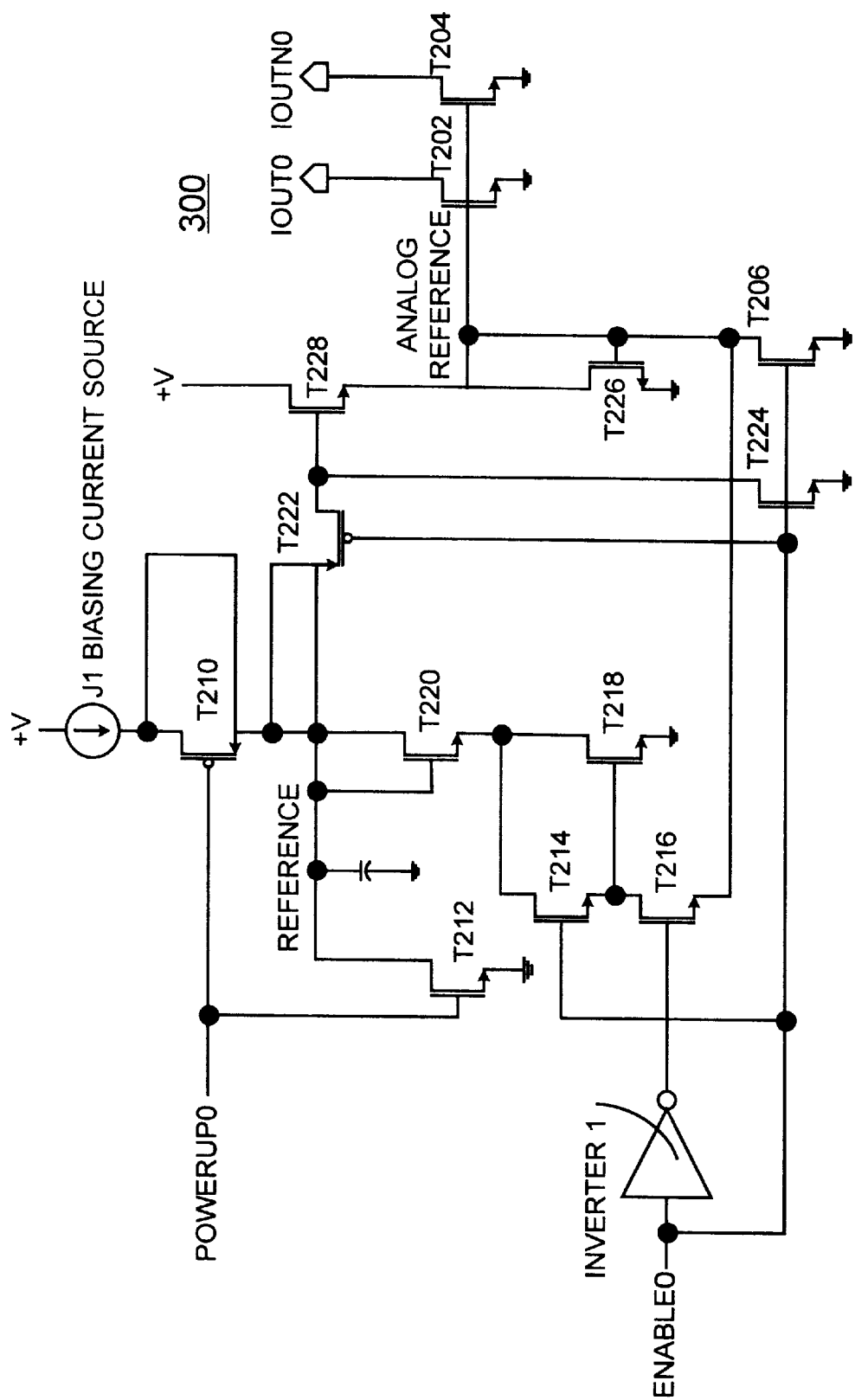
FIG. 3 is a schematic diagram representation of a second circuit for high speed powerup of an analog reference source in accordance with the present invention.

FIG. 3 illustrates a second circuit for high speed powerup of an analog reference source generally designated by the reference character 300 and arranged in accordance with the present invention. In FIG. 3, the same reference numbers are used to illustrate identical components of the first and second high speed powerup circuits 200 and 300. Second high speed powerup circuit 300 includes an NFET T220 instead of the bipolar Q220 in the biasing circuit for the REFERENCE node. Second high speed powerup circuit 300 includes an N-channel field effect transistor (NFET) T228 instead of NPN transistor Q228 to drive the reference gate voltage of current source NFETs T202, T204.

Figure 4:
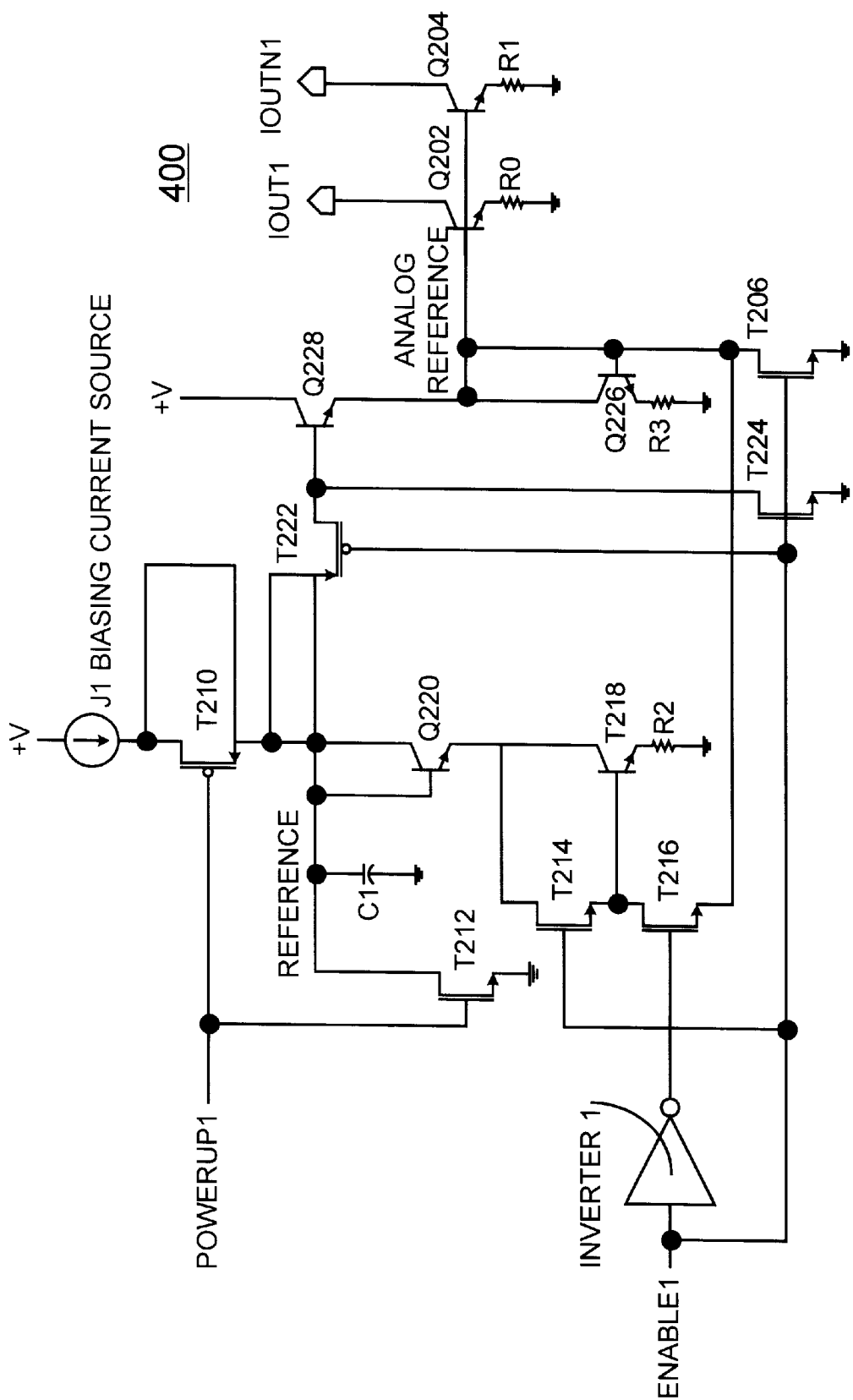
FIG. 4 is a schematic diagram representation of a third circuit for high speed powerup of an analog reference source in accordance with the present invention.

FIG. 4 illustrates a third circuit for high speed powerup of an analog reference source generally designated by the reference character 400 and arranged in accordance with the present invention. In FIG. 4, the same reference numbers are used to illustrate identical components of the first, second and third high speed powerup circuits 200, 300 and 400. Third high speed powerup circuit 400 includes a plurality of bipolar NPN current source transistors Q202, Q204 each including a respective biasing resistor R0, R1 connected the emitter to ground instead of the NFETs T202, T204 of first and second high speed powerup circuits 200, 300 of FIGS. 1 and 2. In the biasing circuitry, NFET 218 is replaced by a bipolar NPN current source transistor Q218 with a biasing resistor R2 connected between its emitter and ground. Similarly, the NFET 226 is replaced by a bipolar NPN current source transistor Q226 with a biasing resistor R3 connected between its emitter and ground.

While the present invention has been described with reference to the details of the embodiments of the invention shown in the drawing, these details are not intended to limit the scope of the invention as claimed in the appended claims.

What is claimed is:

1. A circuit for high speed powerup of an analog reference source, such as used in a direct access storage device (DASD) comprising:

a biasing current source;

biasing circuitry for establishing a first bias reference voltage level; said biasing circuitry including a capacitor connected between ground and said first bias reference voltage level and a continuously enabled transistor for supplying a biasing current to said capacitor;

an enable input for disabling and for enabling powerup of the analog reference source; and a transistor switch coupled between said bias reference voltage level and the analog reference source; said transistor switch operatively controlled by said enable input for enabling powerup of the analog reference source.

2. The circuit for high speed powerup of an analog reference source as recited in claim 1 wherein said biasing circuitry includes a feedback path between said biasing circuitry and the analog reference source.

3. The circuit for high speed powerup of an analog reference source as recited in claim 1 wherein the analog reference source comprises a control input to a plurality of current source transistors.

4. The circuit for high speed powerup of an analog reference source as recited in claim 3 wherein said control input comprises a gate input to said plurality of current source transistors.

5. The circuit for high speed powerup of an analog reference source as recited in claim 3 wherein said control input comprises a base input to said plurality of current source transistors.

6. The circuit for high speed powerup of an analog reference source as recited in claim 1 wherein said transistor switch operatively controlled by said enable input for enabling powerup of the analog reference source includes a helper transistor arranged for assisting in powerup of the analog reference source.

7. The circuit for high speed powerup of an analog reference source as recited in claim 6 wherein said transistor switch and said helper transistor drive the analog reference source responsive to said enable input.

8. A circuit for high speed powerup of an analog reference source, such as used in a direct access storage device (DASD) comprising:

a biasing current source;

biasing circuitry for establishing a first bias reference voltage level; said biasing circuitry including a capacitor, a continuously enabled transistor for supplying a biasing current to said capacitor; and a feedback path between said biasing circuitry and the analog reference source; said biasing circuitry including a first pair of series connected transistors and a second pair of series connected transistors;

an enable input for disabling and for enabling powerup of the analog reference source; and a transistor switch coupled between said bias reference voltage level and the analog reference source; said transistor switch operatively controlled by said enable input for enabling powerup of the analog reference source.

9. The circuit for high speed powerup of an analog reference source as recited in claim 8 wherein said first pair of series connected transistors is coupled between said continuously enabled transistor and ground.

10. The circuit for high speed powerup of an analog reference source as recited in claim 9 wherein said first pair of series connected transistors include a pair of bipolar transistors.

11. The circuit for high speed powerup of an analog reference source as recited in claim 9 wherein said first pair of series connected transistors include a bipolar transistor and a field effect transistor.

12. The circuit for high speed powerup of an analog reference source as recited in claim 8 wherein said second pair of series connected transistors is coupled between a common series connection of said first pair of series connected transistors and the analog reference source.

13. The circuit for high speed powerup of an analog reference source as recited in claim 12 wherein one transistor of said second pair of series connected transistors is turned on by said enable input and the other transistor of said second pair of series connected transistors is turned off by said enable input.

14. The circuit for high speed powerup of an analog reference source as recited in claim 12 wherein a common connection between said second pair of series connected transistors is connected to a control input of one transistor of said first pair of series connected transistors.

15. The circuit for high speed powerup of an analog reference source as recited in claim 8 wherein said first and said second pair of series connected transistors include field effect transistors.

16. The circuit for high speed powerup of an analog reference source as recited in claim 8 wherein said first and said second pair of series connected transistors include a bipolar transistor.

17. A method for high speed powerup of an analog reference source, such as used in a direct access storage device (DASD) comprising the steps of:

utilizing an enable input for disabling and for enabling powerup of the analog reference source;

providing biasing circuitry, utilizing a biasing current source for establishing a first bias reference voltage level; said biasing current source including a capacitor connected between ground and said first bias reference voltage level and a continuously enabled transistor for supplying a biasing current to said capacitor; and enabling a transistor switch coupled between said first bias reference voltage level and the analog reference source and a helper powerup transistor coupled to said transistor switch for driving the analog reference source.

18. The method for high speed powerup of an analog reference source as recited in claim 17 includes the step of utilizing a transistor stack for providing said biasing circuitry, said transistor stack receiving said enable input and including a feedback path from the analog reference source responsive to said enable input.

\* \* \* \* \*